United States Patent
Coyle et al.

[11] Patent Number: 5,853,477
[45] Date of Patent: Dec. 29, 1998

[54] MANUFACTURE OF TRANSITION METAL CARBIDE, NITRIDE AND CARBONITRIDE WHISKERS

[75] Inventors: R. Tom Coyle, Yorba Linda, Calif.; Magnus Ekelund, Järna, Sweden; Mats Nygren, Västerled, Sweden; Mats Johnsson, Hägerstein, Sweden

[73] Assignees: Sandvik AB, Sandviken, Sweden; Advanced Industrial Materials, Yorba Linda, Calif.

[21] Appl. No.: 772,099

[22] Filed: Dec. 20, 1996
(Under 37 CFR 1.47)

Related U.S. Application Data

[63] Continuation-in-part of Ser. No. 504,779, Jul. 20, 1995.

[30] Foreign Application Priority Data

Dec. 22, 1995 [SE] Sweden .................................. 9504626

[51] Int. Cl.$^6$ .................................................. C30B 26/62
[52] U.S. Cl. ............................... 117/87; 117/75; 117/921; 117/954
[58] Field of Search ................................ 117/75, 76, 87, 117/921, 952, 954

[56] References Cited

U.S. PATENT DOCUMENTS

| | | | |
|---|---|---|---|
| 3,754,076 | 8/1973 | Cutler | 423/345 |
| 4,248,844 | 2/1981 | Ramsey, Jr. et al. | 423/345 |
| 4,283,375 | 8/1981 | Horne, Jr. et al. | 423/345 |
| 4,284,612 | 8/1981 | Horne, Jr. et al. | 423/345 |
| 4,883,559 | 11/1989 | Bamberger | 117/75 |
| 4,888,084 | 12/1989 | Nixdorf et al. | 117/75 |
| 5,094,711 | 3/1992 | Narasimhan et al. | 117/87 |
| 5,118,488 | 6/1992 | Bamberger | 117/87 |
| 5,160,574 | 11/1992 | Pearson et al. | 117/75 |
| 5,221,526 | 6/1993 | Qi et al. | 426/275 |
| 5,256,243 | 10/1993 | Kida | 435/7.94 |
| 5,383,421 | 1/1995 | Dunmead et al. | 117/4 |
| 5,403,519 | 4/1995 | Rittler | 252/582 |
| 5,404,836 | 4/1995 | Milewski | 117/87 |
| 5,488,016 | 1/1996 | Rittler | 501/39 |

*Primary Examiner*—Felisa Garrett
*Attorney, Agent, or Firm*—Burns, Doane, Swecker & Mathis, L.L.P.

[57] ABSTRACT

There is disclosed a method of producing, in large volumes and at low cost, Ta, Nb, Zr and Hf carbide, nitride or carbonitride whiskers, preferably submicron, having excellent reinforcing properties, suitable as reinforcement in a wide range of materials, including metals, intermetallics, plastics, ceramics and metallic bonded hard material. Oxides of Ta, Nb, Zr and Hf or alkali compounds thereof in an amount to satisfy the stoichiometric requirements of the desired carbide or nitride are mixed with the carbon source along with an alkali and/or alkali earth metal halogenide as a volatilization agent for the metal and a catalyst for the whisker growth such as Ni and/or Co. The reactant powders are blended in some typical manner using a high speed blender so as to intimately mix them. Finally, the starting material is subjected to nitriding, carbonizing or carbonitriding heat treatments in order to produce the desired whiskers.

7 Claims, 1 Drawing Sheet

MANUFACTURE OF TRANSITION METAL CARBIDE, NITRIDE AND CARBONITRIDE WHISKERS

This application is a continuation-in-part application of U.S. Ser. No. 08/504,779, filed Jul. 20, 1995.

BACKGROUND OF THE INVENTION

The present invention relates to a method of producing, in large volumes and at low cost, transition metal carbide, nitride or carbonitride whiskers, generally of submicron size, having excellent reinforcing properties. These whiskers are suitable for the reinforcement of ceramic cutting tools, metals, intermetallics, plastics and metallic bonded hard material.

During the last decades, great progress has been made in the development of high-performance materials. One of the important reasons to this progress has been the production of inorganic or ceramic whiskers with high tensile strength and modulus values as well as resistance to high temperatures. The incorporation of these whiskers into advanced ceramics, metals and polymers has produced composites with superior properties.

Discontinuous submicron ceramic fibers can be produced by several methods and in these cases they are most often in the form of single crystals or so called "whiskers". Several types of ceramic whiskers (oxides, nitrides, carbides and borides) exist. For example, SiC whiskers are well-known as a successful reinforcement in cutting tool materials. Most of the development work has hence been directed toward silicon carbide whiskers (e.g., $Al_2O_3$-matrix/SiC-whiskers composites). Some efforts have, however, also been made to develop other metal carbide, nitride, and boride whiskers particularly of the transition metals Ti, Ta, Nb, etc. Whiskers with submicron diameter have not, however, been easily available which makes most of these whisker materials less interesting as reinforcement in different types of advanced ceramic materials.

Ceramic whiskers available commercially are in most cases very expensive and in the case of most transition metal whiskers no commercial producer exists.

U.S. Pat. No. 3,754,076 discloses a method of producing silicon carbide whiskers by carbothermal reduction of rice hulls. Rice hulls contain both silica and a significant amount of carbon. When using rice hulls as a raw material the carbon source and the silica are therefore intimately mixed. By heating the raw material, the cellulose gives off gaseous products such as carbon dioxide, carbon monoxide, hydrogen, methane and water vapor. The product contains, besides SiC whiskers and particles, a large amount of excess carbon which has to be removed.

In U.S. Pat. No. 4,248,844 SiC whiskers are produced in a similar process as in U.S. Pat. No. 3,754,076. A part of the rice hulls are, however, ashed in air to remove the carbon and then remixed with a carbonized fraction of rice hulls.

In U.S. Pat. No. 4,283,375 rice hulls are ashed in air to obtain amorphous $SiO_2$ which is blended with fine particle sized carbon. This process is claimed to give β-SiC whiskers with a good yield.

U.S. Pat. No. 4,284,612 describes a process of preparing SiC whiskers by using chopped carbon or graphite fibers made from partly oxidized organic fibers. The fibers should be about 10 to 100 μm in length. The patent does not, however, give any explanation why graphite fibers give a better whisker yield.

U.S. Pat, No. 5,221,526 uses silica and a particulate carbon source together with a boron component and a seeding component to control the shape and size of the produced SiC whiskers. The carbothermal process of producing SiC whiskers has the general potential to produce large amounts to a low cost if the reaction condition can be properly controlled.

U.S. Pat. No. 4,888,084 discloses a method for the preparation of titanium nitride whiskers by carbothermal reaction of mixtures of $TiO_2$, carbonized organic fibers and a catalyst such as Ni or Co. During the process, a halogen, preferably a chlorine-containing gas, is passed over the mixture. It is thought that the carbon fibers perform three functions: i) provide a high void volume necessary for the whisker growth; ii) act as a reducing agent for the titanium oxide; and iii) act as a nucleation site for the whisker growth.

In U.S. Pat. No. 5,256,243 a process of making TiC whiskers from a mixture of $TiO_2$ or alkalimetal compounds thereof, alkalimetalchlorides and carbon by carbothermal reduction is described.

U.S. Pat. No. 4,883,559 discloses a process for making transition metal whiskers from a melt of cyanide salt, alkali metal oxides and a transition metal oxide.

U.S. Pat. No. 5,094,711 discloses a process for producing single crystal titanium carbide whiskers by chemical vapor deposition (CVD).

U.S. Pat. No. 5,160,574 discloses a process for production of small diameter titanium carbide whiskers by a CVD method.

In the case of transition metal carbide, nitride or carbonitride whiskers, the carbothermal process has not been as successful as in the case of silicon carbide whisker synthesis. The CVD process works with a well-controlled composition of the gas phase, but the cost is high and the possibility of producing large amounts of submicron whiskers is low.

OBJECTS AND SUMMARY OF THE INVENTION

It is an object of this invention to avoid or alleviate the problems of the prior art.

It is an object of this invention to provide a method of producing, in large volumes and at low cost, high strength whiskers of the transition metal carbides, nitrides, or carbonitrides which are straight, having smooth surfaces and with a diameter less than 5 μm, preferably submicron, having excellent reinforcing properties in advanced materials.

These and other objects are provided by a method of producing in large volumes transition metal carbide, nitride or carbonitride whiskers comprising intimately mixing, a carbon source, a transition metal compound in an amount to satisfy the stoichiometric requirements of the desired whisker, at least one of the alkali, alkali earth halogenide containing salts LiCl, NaCl, KCl, $CaCl_2$, $MgCl_2$, LiF, NaF or KF in an alkali-alkali earth-halogenide/transition metal molar ratio 0.1–3, and a Ni and/or Co-containing catalyst in (Ni+Co)/transition metal molar ratio 0.005–0.5 and heating the mixture to 1000°–1800° C., for 1–15 hours, at 10 mbar-50 bar pressure in an inert or non-oxidizing atmosphere depending on the desired whiskers.

DETAILED DESCRIPTION OF THE PREFERRED EMBODIMENTS OF THE INVENTION

Figure 1:
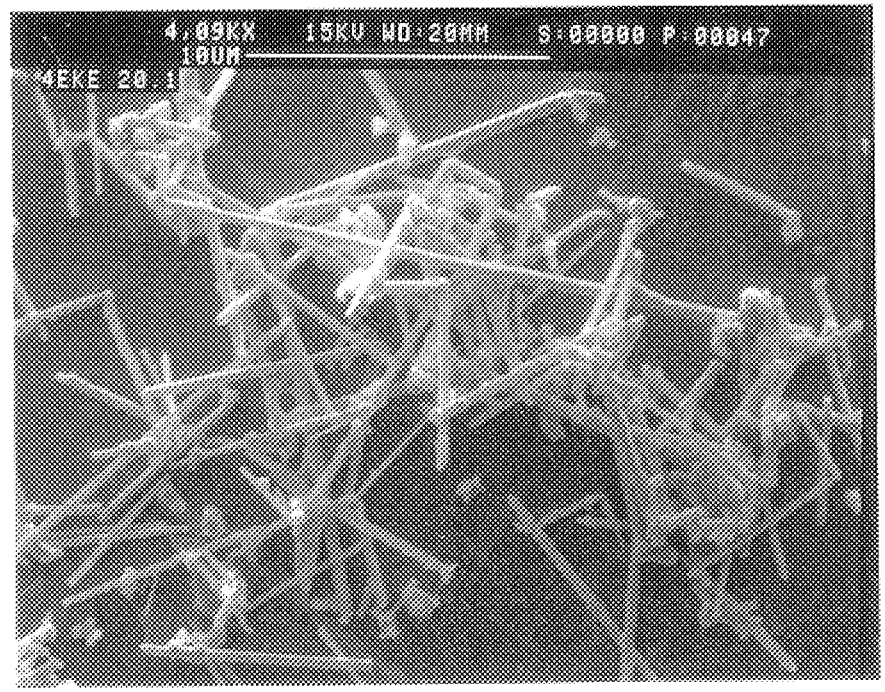
FIGS. 1 and 2 show SEM micrographs of whiskers synthesized according to the presently claimed invention.
Figure 2:
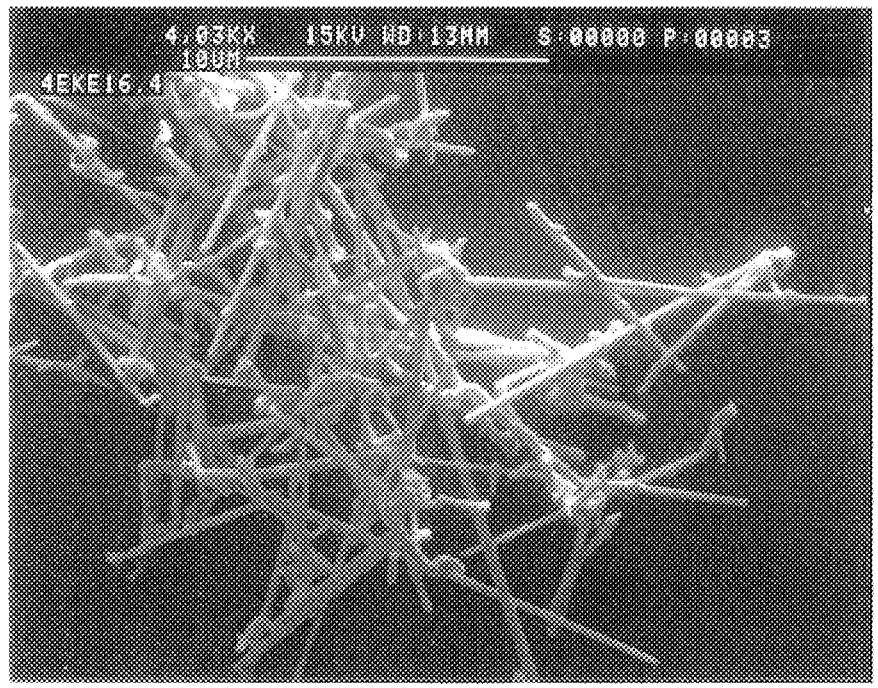

In FIGS. 1 and 2, the whisker growth in the invention is a VLS-like crystal growth process (VLS=Vapor-Liquid-Solid). This process implies transport of the transition metal as a vapor species to a liquid catalyst at which the desired whisker is grown as a solid. The halogenide source is added as a volatilizing agent for transportation of the transition metal in a gas phase, e.g., as a chloride or oxochloride. One of several possible reaction sequences when $Cl_2(g)$ is used as chlorine source is:

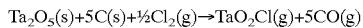

$$Ta_2O_5(s) + 5C(s) + \tfrac{1}{2}Cl_2(g) \rightarrow TaO_2Cl(g) + 5CO(g)$$

The formation of a volatile Ta-species provides for a gas phase transportation of Ta to the liquid metal catalyst where it reacts further with C and/or N to form a whisker of the composition $TaC_{1-x}N_x$. The obtained X-value depends on the composition of the starting mixture, reaction temperature and atmosphere used. The VLS growth process involves several reactions which one by one and/or in combination have to be optimized in order to obtain maximum yield of whiskers.

According to the presently claimed invention, it is possible to synthesize submicron diameter whiskers of transition metal carbide, nitride or carbonitride, of Ta, Nb, Hf and Zr from starting mixtures of transition metal oxides, hydroxides or alkalioxides thereof and carbon powder, carbon fiber or carbon powder with a volatile part and an alkali and/or alkali earth metalhalogenide using a catalyst such as Ni and/or Co. The obtained whiskers are of superior quality, are smooth and straight and are useful as reinforcement in different types of materials, e.g., plastics, metals, intermetallics, metallic bonded hard materials and ceramics.

The highest yields obtained with the present process have been obtained by using a carbon powder with a primary grain size of, preferably, 10–50 nm and with a volatile part, between 10 weight % and 30 weight %, which volatilizes at temperatures up to 1000° C., preferably above 500° C., so that the porosity of the starting mixture is kept at a high level through the whole reaction. This facilitates the growth of whiskers within the volume of the starting mixture and provides the whisker with an accurate mixture of gas species, that are generated from the starting mixture. The porosity also makes it easy for nitrogen/argon to penetrate the reaction mixture. Carbon powder with such a volatile portion is commercially available, for example, from Degussa AG. The carbon source is an oxidized carbon black that has oxide containing functional groups like carboxyl and chinon on the surface of the powder which are the volatile portion and volatize at temperatures up to 1000° C. It may also contain some hydrocarbons. The carbon powder is easily obtainable, either easy to produce in great amounts or commercially available, for example Degussa Color Black FW200 or FW2, Degussa Special Black 6, 5 or 4, which normally are used as black pigment. This way of obtaining a porous reaction mixture can easily be controlled compared to if one uses carbon fibers or powders.

The reaction mixture consists of transition metal oxide, hydroxide or alkalioxide compounds thereof with a grain size of about −325 mesh (typically 1–50 μm) and preferably a fluffy appearance and the above-mentioned carbon powder, in amounts to satisfy the stoichiometric requirements of the desired compound to be produced (e.g., carbide or nitride). An alkali and/or alkali earth metal halogenide like NaF, NaCl, KCl or $CaCl_2$ of conventional grain size, alone or in combination, in a molar ratio of 0.1–2, preferably 0.5–1 (alkali, alkali earth-metalhalogenide/transition metaloxide), is added as a volatilization agent for the transition metal. A 50/50 mixture of microsized salt, about 10 μm in size and a coarse salt of about 2 mm in size has been found to give a good result. A catalyst for the whisker growth, a Ni and/or Co-containing powder of conventional grain size, is added in catalyst/transition metal oxide molar ratio 0.005–0.5, preferably 0.02–0.1. The reactant powders are mixed, wet or dry, preferably dry, in some conventional manner using a high speed blender so as to intimately mix them. The bulk density of the reaction mixture should be low so that the mixture shall have a flowing appearance, the surfaces of the powders are accessible to reaction gases and reaction products can be removed. The bulk density for a particular mixture can be readily determined by the skilled artisan.

The reactant mixture is heated in a graphite furnace at 1000°–1800° C., preferably 1100°–1500° C., in an atmosphere containing Ar, He, $N_2$, $H_2$, $Cl_2$ or HCl or mixtures thereof, with a small (≈50 ml/min) gas flow. The holding time at reaction temperature ranges from 1 to 15 hours and the pressure from 10 mbar to 50 bar, preferably 0.5 to 5 bar.

The mole fraction carbon/transition metal depends on the transition metal source and the desired product (nitride, carbide or carbonitride).

Also depending on the type of transition metal and the type of whiskers to be produced, different synthesis parameters such as temperature and gas phase composition must be chosen.

For the production of Ta, Nb, Hf, and Zr carbonitride or nitride-whiskers according to the invention $N_2$ gas is utilized. The overall chemical reaction can be written, e.g., for $Ta_2O_5$:

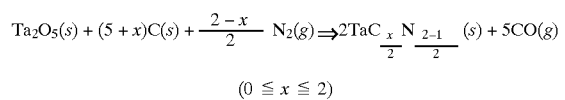

$$Ta_2O_5(s) + (5+x)C(s) + \tfrac{2-x}{2} N_2(g) \Rightarrow 2TaC_{\tfrac{x}{2}}N_{\tfrac{2-1}{2}}(s) + 5CO(g)$$

$$(0 \leq x \leq 2)$$

It is essential for this reaction to proceed to the right, that the CO(g) partial-pressure is held sufficiently low and that nitrogen gas is provided to the interior of the reaction mixture. This means that the nitrogen must penetrate the reaction mixture whose porosity is held at highest possible level using the carbon powder according to the invention.

In this way high quality whiskers of carbonitride or nitride with low levels of residual free oxygen are obtained.

If carbon fulfilling the stoichiometric requirements for producing carbide whiskers is used in the starting mixture, the overall chemical reaction can be written, e.g., for $Ta_2O$:

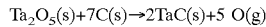

$$Ta_2O_5(s) + 7C(s) \rightarrow 2TaC(s) + 5 O(g)$$

The temperature is preferably held between 1100° C. and 1500° C. in a nitrogen and/or argon atmosphere and the pressure in the reaction zone can be up to 50 bar, preferably 0.5–5 bar.

If this synthesis route is followed, carbide whiskers of extremely high quality with low levels of nitrogen and oxygen can be produced.

By choosing an intermediate amount of carbon, a nitrogen atmosphere and a temperature in the same range as for the carbide synthesis, carbonitride whiskers are obtained.

The result of the synthesis according to the invention is a mixture of generally submicron, smooth and straight whiskers in an amount between 70% and 100% by volume and very small (≦1 μm) particles of the synthesized product. This high yield makes an extra separation of whiskers and particles plus the residual carbon unnecessary. However, if an even higher yield is desired, a subsequent refinement step can be applied.

The optimal conditions given above, both starting formulation and synthesis parameters, depend on the equipment used for the synthesis and the choice of raw materials. It is within the purview of the skilled artisan using other equipment and other raw materials to determine the optimal conditions by experiments.

The invention is additionally illustrated in connection with the following Examples which are to be considered as illustrative of the present invention. It should be understood, however, that the invention is not limited to the specific details of the Examples.

EXAMPLE 1

$Ta_2O_5$ powder (Cerac, T-1013, -325 mesh) was mixed with carbon powder (Degussa FW200) with mole fraction $C/Ta_2O_5=5.3$, 0.5 mole fractions of $NaCl/Ta_2O_5$ (NaCl/Akzo) and 0.02 mole fractions of $Ni/Ta_2O_5$ (Ni, Cerac, N1023, -325 mesh) were also added. The powders were mixed in a high speed blender and then subjected to a carbothermal nitridation with the following process parameters

T=1220° C.

t=5 hours $p(N_2)$=1 bar

The whiskers produced consisted of Ta(N,C) with a lattice parameter of 4.37 Å. The whiskers are straight and of submicron size (see FIG. 1). A typical yield is 80 volume %.

EXAMPLE 2

Example 1 was repeated with the following changes in the synthesis parameters:

$C/Ta_2O_5$=7.0

T=1250° C.

t=5 hours p(Ar)=800 mbar

A SEM micrograph of the resultant TaC whiskers, which were straight with smooth surfaces of submicron size, is shown in FIG. 2. The whiskers were pure TaC with a lattice parameter of 4.45 Å. A typical yield is 80 volume %.

EXAMPLE 3

NbC whiskers were produced using $Nb_2O_5$ (Cerac N-1117, -325 mesh) and with the following synthesis parameters:

$C/Nb_2O_5$=7.0

$Ni/Nb_2O_5$=0.02

$NaCl/Nb_2O_5$=0.5

T=1300° C.

t=5 hours p(Ar)=800 mbar

The whiskers were pure NbC with a lattice parameter of 4.47 Å. The whiskers had smooth surface morphology and were of submicron size. A typical yield is 70 volume %.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of producing large volumes of transition metal carbide, nitride or carbonitride whiskers comprising;

mixing a carbon source, a transition metal compound, at least one of the alkali, alkali earth halogenide containing salts LiCl, NaCl, KCl, $CaCl_2$, $MgCl_2$, LiF, NaF or KF in an alkali—alkali earth-halogenide/transition metal molar ratio 0.1–3, and at least one of a Ni containing and Co-containing catalyst in (Ni+Co)/transition metal molar ratio 0.005–0.5 and heating the mixture to 1000°–1800° C., for 1–15 hours, at 10 mbar-50 bar pressure in an inert or non-oxidizing atmosphere depending on the desired whiskers.

2. The method of claim 1 wherein the atmosphere is $N_2$, Ar, He or $H_2$ or mixtures thereof.

3. The method of claim 1 wherein the transition metal compound is at lease one of an oxide, hydroxide and alkali oxide transition metal compound.

4. The method of claim 1 wherein the carbon powder has a primary grain size of 10–50 nm.

5. The method of claim 1 wherein the carbon source contains a volatile portion of 10–30 weight % of the carbon source.

6. The method of claim 1 wherein the mixture is heated to a temperature of 1100°–1500° C.

7. The method of claim 1 wherein the atmosphere also contains a halogenide-containing gas.

* * * * *